(12) United States Patent
Kong et al.

(10) Patent No.: US 9,847,400 B2
(45) Date of Patent: Dec. 19, 2017

(54) ARRAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Xiangyong Kong, Beijing (CN); Lung Pao Hsin, Beijing (CN); Jun Cheng, Beijing (CN)

( * ) Notice: Subject to any disclaimer, the term of this patent is extended or adjusted under 35 U.S.C. 154(b) by 0 days.

(21) Appl. No.: 15/313,141

(22) PCT Filed: Mar. 28, 2016

(86) PCT No.: PCT/CN2016/077489
§ 371 (c)(1),
(2) Date: Nov. 22, 2016

(87) PCT Pub. No.: WO2016/192447
PCT Pub. Date: Dec. 8, 2016

(65) Prior Publication Data
US 2017/0194448 A1 Jul. 6, 2017

(30) Foreign Application Priority Data
Jun. 4, 2015 (CN) .......................... 2015 1 0303435

(51) Int. Cl.
*H01L 29/10* (2006.01)
*H01L 29/45* (2006.01)
(Continued)

(52) U.S. Cl.
CPC ........ *H01L 29/45* (2013.01); *H01L 21/31144* (2013.01); *H01L 21/47573* (2013.01);
(Continued)

(58) Field of Classification Search
CPC ......... H01L 21/31144; H01L 21/47573; H01L 21/76802; H01L 29/78618; H01L 29/45; H01L 29/66969; H01L 29/7869
See application file for complete search history.

(56) References Cited

U.S. PATENT DOCUMENTS

2011/0084278 A1* 4/2011 Cho ................. H01L 27/1214
257/59
2012/0018720 A1* 1/2012 Park ................ H01L 27/1214
257/43
(Continued)

FOREIGN PATENT DOCUMENTS

CN 104022076 A 9/2014

OTHER PUBLICATIONS

PCT International Written Opinion, Application PCT/CN2016/077489, Jul. 12, 2016, 10 pps.: with English Translation.

*Primary Examiner* — Yosef Gerbreyesus

(57) ABSTRACT

Embodiments of the present disclosure provide an array substrate and a manufacturing method thereof, and a display device. The array substrate includes a base substrate, a first electrode pattern, a second electrode pattern, and an active layer pattern disposed on the base substrate, a first electrode protection pattern coating the first electrode pattern, and a second electrode protection pattern coating the second electrode pattern. The active layer pattern is disposed between the first electrode pattern and the second electrode pattern. The first electrode protection pattern and the second electrode protection pattern are connected to two sides of the active layer pattern, respectively. The problem that, the active layer pattern cannot be connected to the first electrode pattern and the second electrode pattern due to the surface oxidation, when the first electrode pattern and the second
(Continued)

electrode pattern adopt material with low resistance characteristic, is avoided, thus increasing the product yield.

18 Claims, 2 Drawing Sheets

(51) Int. Cl.
    *H01L 21/768* (2006.01)
    *H01L 21/311* (2006.01)
    *H01L 29/786* (2006.01)
    *H01L 21/4757* (2006.01)
    *H01L 29/66* (2006.01)
    *H01L 29/417* (2006.01)

(52) U.S. Cl.
    CPC .. *H01L 21/76802* (2013.01); *H01L 29/41733* (2013.01); *H01L 29/66969* (2013.01); *H01L 29/7869* (2013.01); *H01L 29/78618* (2013.01)

(56) References Cited

U.S. PATENT DOCUMENTS

| | | | | |
|---|---|---|---|---|
| 2014/0183529 | A1* | 7/2014 | Yamazaki | H01L 29/7869 257/43 |
| 2015/0155310 | A1* | 6/2015 | Lee | H01L 27/1225 257/43 |

* cited by examiner

ARRAY SUBSTRATE AND MANUFACTURING METHOD THEREOF, AND DISPLAY DEVICE

CROSS REFERENCE TO RELATED APPLICATIONS

This application is a National Stage entry of PCT/CN2016/077489 filed Mar. 28, 2016, which claims the benefit and priority of Chinese Patent Application No. 201510303435.8, filed on Jun. 4, 2015, the disclosures of which are incorporated herein in their entirety as part of the present application.

BACKGROUND

The present disclosure relates to the field of display technology, and particularly, to an array substrate and a manufacturing method thereof, and a display device.

In recent years, the display technology has developed rapidly. In the field of display technology represented by Liquid Crystal Display (abbreviated as LCD), an improved resolution, and an increased display size has resulted in a demand for low resistance wiring in the integration of a driver circuit into a display device. Thus, a metal with low resistance characteristic, such as copper (Cu), has been applied to a gate line, a data line, as well as a gate electrode, a source electrode and a drain electrode of a thin film transistor (abbreviated as TFT) in the display device.

However, since the metal with low resistance characteristic, such as copper or copper alloy, has a relatively strong activity, the surface of the metal is prone to be oxidated when an active layer connecting the source electrode and the drain electrode is formed by etching. The thickness of the oxidation layer increases as time goes on, thereby leading to the increase in the contact resistances of the source electrode and the drain resulting electrode. This results in excessively high connection resistances of the active layer pattern with the source electrode pattern and the drain electrode pattern. Further, the yield of the product may be affected.

BRIEF DESCRIPTION

Embodiments of the present disclosure provide an array substrate and a manufacturing method thereof, and a display device, to avoid the problem that, when a first electrode pattern and a second electrode pattern adopt a material with low resistance characteristic, due to the oxidation on the surface thereof, the connection resistances of the active layer with the first electrode pattern and the second electrode pattern are too high.

According to a first aspect, embodiments of the present disclosure provide an array substrate including a base substrate, a first electrode pattern, a second electrode pattern, and an active layer pattern disposed on the base substrate, a first electrode protection pattern coating the first electrode pattern, and a second electrode protection pattern coating the second electrode pattern. The active layer pattern is disposed between the first electrode pattern and the second electrode pattern. The first electrode protection pattern and the second electrode protection pattern are connected to two sides of the active layer pattern, respectively.

In embodiments of the present disclosure, the material for the first electrode pattern and of the second electrode pattern is copper or a copper alloy.

In embodiments of the present disclosure, the first electrode pattern, except for the lower surface in contact with the base substrate, is covered by the first electrode protection pattern. The first electrode protection pattern extends a first extension portion towards the active layer pattern, and the first extension portion is covered by the first side of the active layer pattern. The second electrode pattern, except for the lower surface in contact with the base substrate, is covered by the second electrode protection pattern. The second electrode protection pattern extends a second extension portion towards the active layer pattern, and the second extension portion is covered by the second side of the active layer pattern.

In embodiments of the present disclosure, the array substrate further includes a first buffer layer pattern disposed between the first electrode pattern and the first electrode protection pattern, and a second buffer layer pattern disposed between the second electrode pattern and the second electrode protection pattern.

In embodiments of the present disclosure, the material for the first electrode protection pattern, the second electrode protection pattern, the first buffer layer pattern and/or the second buffer layer pattern is a molybdenum-niobium alloy or titanium.

In embodiments of the present disclosure, the array substrate further includes a gate insulation layer pattern disposed above the first electrode protection pattern, the second electrode protection pattern and the active layer pattern, and a gate electrode pattern and a pixel electrode pattern disposed above the gate insulation layer pattern. The gate insulation layer pattern includes a via hole configured to electrically connect the pixel electrode pattern with the first electrode protection pattern or the second electrode protection pattern.

According to a second aspect, embodiments of the present disclosure provide a manufacturing method for an array substrate, including forming a base substrate, forming a first electrode pattern and a second electrode pattern on the base substrate, forming a first electrode protection pattern coating the first electrode pattern and a second electrode protection pattern coating the second electrode pattern, and forming an active layer pattern between the first electrode protection pattern and the second electrode protection pattern. The first electrode protection pattern and the second electrode protection pattern are connected to two sides of the active layer pattern, respectively.

In embodiments of the present disclosure, when the first electrode pattern and the second electrode pattern are formed on the base substrate, a first buffer layer pattern covering on the surface of the first electrode pattern and a second buffer layer pattern covering on the surface of the second electrode pattern are further formed. The first electrode protection pattern coats the first buffer layer pattern and the first electrode pattern, and the second electrode protection pattern coats the second buffer layer pattern and the second electrode pattern.

In embodiments of the present disclosure, when the first electrode pattern and the second electrode pattern are formed on the base substrate, further forming a first buffer layer pattern covering on the surface of the first electrode pattern and a second buffer layer pattern covering on the surface of the second electrode pattern includes forming an electrode material layer on the base substrate, forming a buffer material layer after forming the electrode material layer, and forming a first electrode pattern, a second electrode pattern, and a first buffer layer pattern and a second buffer layer pattern by a patterning process.

In embodiments of the present disclosure, the method further includes forming a gate insulation layer pattern including a via hole above the first electrode protection pattern, the second electrode protection pattern, and the active layer pattern, and forming a gate electrode pattern and a pixel electrode pattern above the gate insulation layer pattern by the same patterning process. The pixel electrode pattern is electrically connected to the first electrode protection pattern or the second electrode protection pattern through the via hole.

In embodiments of the present disclosure, the material for the first electrode protection pattern, the second electrode protection pattern, the first buffer layer pattern, and/or the second buffer layer pattern is a molybdenum-niobium alloy or titanium.

In embodiments of the present disclosure, the material for the first electrode pattern and the second electrode pattern is copper or a copper alloy.

According to a third aspect, embodiments of the present disclosure also provide a display device including the above-described array substrate.

It can be seen from the above-described technical solutions, embodiments of the present disclosure provide the array substrate and the manufacturing method thereof, and the display device. Over the first electrode pattern and the second electrode pattern made of a low resistance material, the first electrode protection pattern and the second electrode protection pattern are formed. The first electrode protection pattern coats the first electrode pattern, and the second electrode protection pattern coats the second electrode pattern. An active layer pattern between the first electrode protection pattern and the second electrode protection pattern is formed. It avoids the problem that, when the first electrode pattern and the second electrode pattern adopt a material with low resistance characteristic, due to the oxidation on the surface thereof, the connection resistances of the active layer pattern with, the first and second electrode patterns are too high. Thus, the yield of product is improved.

BRIEF DESCRIPTION OF THE DRAWINGS

In order to more clearly illustrate the technical solutions of the embodiments of the present disclosure, the accompanying drawings of the embodiments will be briefly described. It should be understood that the drawings described below relate only to some embodiments of the present disclosure, and are not intended to limit the present disclosure, wherein.

DETAILED DESCRIPTION

Hereinafter, embodiments of the present disclosure will be further described in conjunction to the accompanying drawings. The following embodiments are only intended to more clearly illustrate the technical solutions of the embodiments of the present disclosure but not to limit the scope of the present disclosure.

Figure 1:
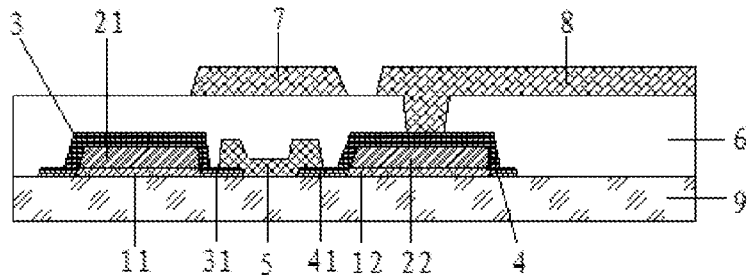
FIG. 1 is a schematic structural view of an array substrate provided according to embodiments of the present disclosure.

FIG. 1 is a schematic structural view of an array substrate provided according to embodiments of the present disclosure. As shown in FIG. 1, embodiments of the present disclosure provide an array substrate including a base substrate 9, a first electrode pattern 11, a second electrode pattern 12, and an active layer pattern 5 disposed on the base substrate 9, a first electrode protection pattern 3 coating the first electrode pattern 11, and a second electrode protection pattern 4 coating the second electrode pattern 12. The active layer pattern 5 is disposed between the first electrode pattern 11 and the second electrode pattern 12. The first electrode protection pattern 3 and the second electrode protection pattern 4 are connected to two sides of the active layer pattern 5, respectively.

Over the first electrode pattern 11 and the second electrode pattern 12 made of a low resistance material, the first electrode protection pattern 3 and second electrode protection pattern 4 are formed. The first electrode protection pattern 3 coats the first electrode pattern 11. The second electrode protection pattern 4 coats the second electrode pattern 12. An active layer pattern 5 between the first electrode protection pattern 3 and the second electrode protection pattern 4 is formed. The array substrate avoids the problem that, when the first electrode pattern 11 and the second electrode pattern 12 adopt a material with low resistance characteristic, due to the oxidation on the surface thereof, the connection resistances of the active layer pattern 5 with the first electrode pattern 11 and the second electrode pattern 12 are too high. Thus, increase the yield of product is improved.

The material for the first electrode pattern 11 and the second electrode pattern 12 has low resistance characteristic and relatively strong activity, such as copper or a copper alloy. In the embodiments of the present disclosure, copper is took as example. The material for the active layer pattern 5 may adopt at least one of transparent metal oxide semiconductor materials such as Indium Gallium. Zinc Oxide (abbreviated as IGZO), Indium Tin Zinc Oxide (abbreviated as ITZO), Indium Oxide ($In_2O_3$), and Zinc Oxide (ZnO).

The first electrode pattern 11, except for the lower surface in contact with the base substrate 9, is covered by the first electrode protection pattern 3. The first electrode protection pattern 3 extends a first extension portion 31 towards the active layer pattern 5. The first extension portion 31 is covered by the first side of the active layer pattern 5. The second electrode pattern 12, except for the lower surface in contact with the base substrate 9, is covered by the second electrode protection pattern 4. The second electrode protection pattern 4 extends a second extension portion 41 towards the active layer pattern 5. The and the second extension portion 41 is covered by the active layer pattern 5.

In order to prevent the oxidation of Cu in the first electrode pattern 11 and the second electrode pattern 12 when forming the first electrode protection pattern 3 coating the first electrode pattern 11 and the second electrode protection pattern 4 coating the second electrode pattern 12, the above-described array substrate further includes a first buffer layer pattern 21, and a second buffer layer pattern 22. The first buffer layer pattern 21 is disposed between the first electrode pattern 11 and the first electrode protection pattern 3. The second buffer layer pattern 22 is disposed between the second electrode pattern 12 and the second electrode protection pattern 4. The first buffer layer pattern 21 and the second buffer layer pattern 22 cover the first electrode pattern 11 and the second electrode pattern 12, respectively. The oxidation of Cu on the surfaces of the first electrode pattern 11 and the second electrode pattern 12 are effectively prevented, when forming the first electrode protection pattern 3 and the second electrode protection pattern 4.

It is to be understood that the materials of the first electrode protection pattern 3, the second electrode protection pattern 4, the first buffer layer pattern 21, and/or the second buffer layer pattern 22 are materials for preventing the oxidation and diffusion of Cu, for example, a molybdenum-niobium alloy (MoNb) or titanium (Ti).

The array substrate further includes a gate insulation layer pattern 6 disposed above the first electrode protection pattern 3, the second electrode protection pattern 4 and the active layer pattern 5. The array substrate further includes a gate electrode pattern 7 and a pixel electrode pattern 8 disposed above the gate insulation layer pattern 6. The gate insulation layer pattern 6 includes a via hole. The via hole is configured to electrically connect the pixel electrode pattern 8 with the first electrode protection pattern 3 or the second electrode protection pattern 4.

Figure 7:
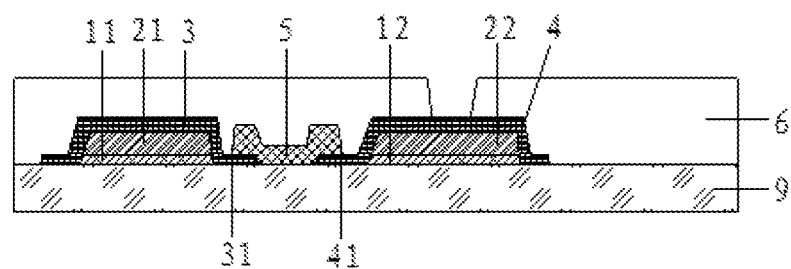
FIG. 7 is a schematic structural view after the fifth step is completed in the manufacturing of the array substrate according to the embodiments of the present disclosure.

In the embodiments of the present disclosure, the first electrode pattern 11 and the second electrode pattern 12 described above may be a source electrode pattern and a drain electrode pattern. That is, when the first electrode pattern 11 represents a source electrode pattern, the second electrode pattern 12 represents the drain electrode pattern. Correspondingly, the first electrode protection pattern 3 coating the first electrode pattern 11 is electrically connected with the source electrode pattern, and the second electrode protection pattern 4 coating the second electrode pattern 12 is electrically connected to the drain electrode pattern. The pixel electrode pattern 8 is electrically connected to the second electrode protection pattern 4 which is electrically connected to the drain pattern. In turn, if the first electrode pattern 11 represents the drain electrode pattern and the second electrode pattern 12 represents the source electrode pattern, the pixel electrode pattern 8 then is electrically connected to the first electrode protection pattern 3 which is electrically connected to the drain electrode pattern. It is to be understood that the embodiments of the present disclosure in FIG. 7 is described by example of the first electrode pattern 11 representing the source electrode pattern and the second electrode pattern 12 representing the drain electrode pattern.

Figure 2:
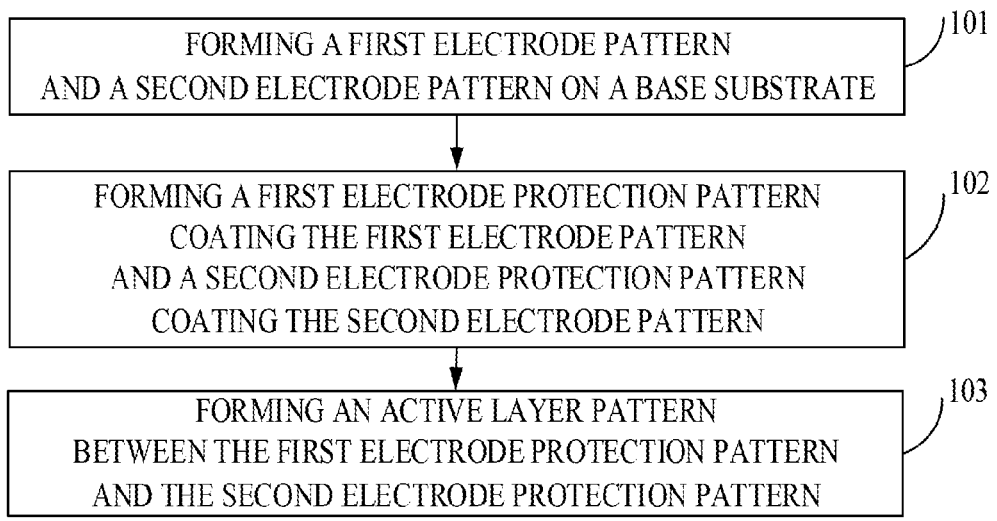
FIG. 2 is a schematic flowchart of a manufacturing method for the array substrate shown in FIG. 1.

FIG. 2 is a schematic flowchart of a manufacturing method for the array substrate shown in FIG. 1. As shown in FIG. 2, the embodiments of the present disclosure also provide a manufacturing method for an array substrate, which further includes, after forming the base substrate 9, the following steps:

Step 101: forming a first electrode pattern 11 and a second electrode pattern 12 on the base substrate 9;

Step 102: forming a first electrode protection pattern 3 coating the first electrode pattern 11 and a second electrode protection pattern 4 coating the second electrode pattern 12;

Step 103: forming an active layer pattern 5 between the first electrode protection pattern 3 and the second electrode protection pattern 4, wherein the first electrode protection pattern and the second electrode protection pattern are respectively connected to two sides of the active layer pattern.

The method effectively prevents the diffusion of Cu of the first electrode pattern 11 and the second electrode pattern 12, by first forming the first electrode pattern 11 and the second electrode pattern 12 with a material having low resistance characteristic, then forming the first electrode protection pattern 3 coating the first electrode pattern 11 and the second electrode protection pattern 4 coating the second electrode pattern 12 on the first electrode pattern 11 and the second electrode pattern 12, respectively. The method effectively prevents the oxidation of Cu during etching the active layer pattern 5 by forming an active layer pattern 5 between the first electrode protection pattern 3 and the second electrode protection pattern 4, rather than directly forming the active layer pattern 5 between the first electrode pattern 11 and the second electrode pattern 12, thus further prevent the problem that the resistances of the active layer pattern 5 with the first electrode pattern 11 and the second electrode pattern 12 are too high.

Figure 3:
FIG. 3 is a schematic structural view after the first step is completed in the manufacturing of the array substrate according to the embodiments of the present disclosure.
Figure 4:
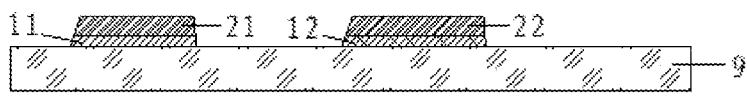
FIG. 4 is a schematic structural view after the second step is completed in the manufacturing of the array substrate according to the embodiments of the present disclosure.
Figure 5:
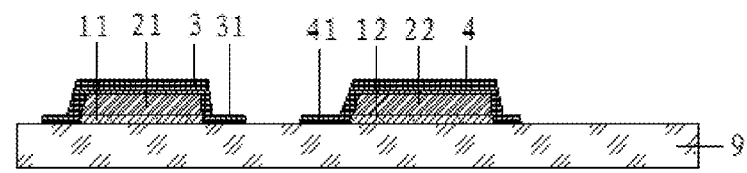
FIG. 5 is a schematic structural view after the third step is completed in the manufacturing of the array substrate according to the embodiments of the present disclosure.
Figure 6:
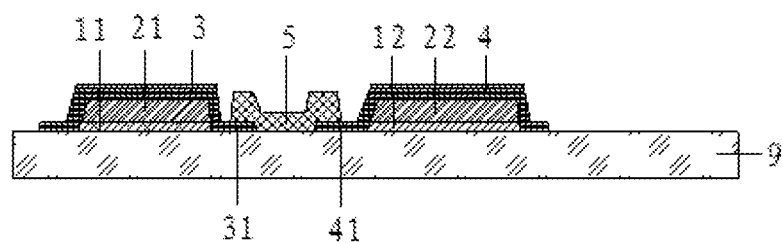
FIG. 6 is a schematic structural view after the fourth step is completed in the manufacturing of the array substrate according to the embodiments of the present disclosure.

FIG. 3 is a schematic structural view after the first step is completed in the manufacturing of the array substrate according to the embodiments of the present disclosure. FIG. 4 is a schematic structural view after the second step is completed in the manufacturing of the array substrate according to the embodiments of the present disclosure. FIG. 5 is a schematic structural view after the third step is completed in the manufacturing of the array substrate according to the embodiments of the present disclosure. FIG. 6 is a schematic structural view after the fourth step is completed in the manufacturing of the array substrate according to the embodiments of the present disclosure. FIG. 7 is a schematic structural view after the fifth step is completed in the manufacturing of the array substrate according to the embodiments of the present disclosure.

The flow of the manufacturing method for the array substrate will be described in detail below. The flow of the manufacturing method for the array substrate may include the following steps:

In step 201: an electrode material layer 1 is formed on the base substrate 9 and a buffer material layer 2 is formed after forming the electrode material layer 1, as shown in FIG. 3.

For example, the above-described base substrate 9 may be a glass substrate, a quartz substrate, or an organic resin substrate. The material for the electrode material layer 1 is a material with low resistance characteristic and relatively strong activity, such as copper or a copper alloy. The embodiments of the present disclosure are described by example of Cu. The material for the first buffer layer pattern 21 and the second buffer layer pattern 22 is material for preventing oxidation of Cu and diffusion of Cu, such as, a molybdenum-niobium alloy (MoNb), titanium (Ti) or the like.

In step 202: a first electrode pattern 11, a second electrode pattern 12, a first buffer layer pattern 21 covering on the surface of the first electrode pattern 11, and a second buffer layer pattern 22 covering on the surface of the second electrode pattern 12 are formed by a patterning process, as shown in FIG. 4.

In step 203: a first electrode protection pattern 3 coating the first buffer layer pattern 21 and the first electrode pattern 11 is formed, and a second electrode protection pattern 4 coating the second buffer layer pattern 22 and the second electrode pattern 12 is formed.

As shown in FIG. 5, the first electrode protection pattern 3 coats the first electrode pattern 11 except for the portion in contact with the base substrate 9. Each end of the first electrode protection pattern 3 includes a first extension portion 31 provided on the base substrate 9, The second electrode protection pattern 4 coats the second electrode pattern 12 except for the portion in contact with the base substrate 9. Each end of the second electrode pattern 12 includes a second extension portion 41 provided on the base substrate 9. A first extended portion 31 of the first electrode protection pattern 3 and a second extended portion 41 of the second electrode protection pattern 4 are connected to two sides of the active layer pattern 5, respectively.

The forming the first electrode protection pattern 3 and the second electrode protection pattern 4 in the above-described step 103 may be understood as, depositing an electrode protection material layer above the first electrode pattern 11, the first buffer layer pattern 21, the second electrode pattern 12, and the second buffer layer pattern 22, and then forming the first electrode protection pattern 3 and the second electrode protection pattern 4 by an etching patterning process. This embodiment is for illustrative purposes only, and the embodiments of the present disclosure are not limited by it.

The material for the first electrode protection pattern 3 and the second electrode protection pattern 4 is a material for preventing oxidation of Cu and diffusion of Cu, such as, a molybdenum-niobium alloy (MoNb), titanium (Ti) or the like.

In the above-described steps 201 to 203, it is possible to manufacture an array substrate of higher resolution, better performance, and larger size by using the electrode material layer 1 with low resistance characteristic. Forming the buffer material layer 2 on the electrode material layer can effectively prevent the diffusion of Cu of the electrode material layer and prevent the oxidation of Cu of a large area in the subsequent process of etching the first electrode protection pattern 3 and the second electrode protection pattern 4. The first electrode pattern 11, the second electrode pattern 12, the first buffer layer pattern 21 covering on the surface of the first electrode pattern, and the second buffer layer pattern 22 covering on the surface of the second electrode pattern are formed by a patterning process. The process of forming the first electrode pattern 11 and the second electrode pattern 12 may be simplified. At the same time, it effectively prevents the problem of diffusion and oxidation of Cu of the first electrode pattern 11 and the second electrode pattern 12.

In step 204, an active layer pattern 5 respectively connected to the first electrode protection pattern 3 and the second electrode protection pattern 4 is formed between the first electrode protection pattern 3 and the second electrode protection pattern 4, as shown in FIG. 6.

In step 205, a gate insulation layer is deposited on the first electrode protection pattern 3, the second electrode protection pattern 4, and the active layer pattern 5. The gate insulation layer is patterned to form a gate insulation layer pattern 6 including a via hole, as shown in FIG. 7.

In step 206, a transparent conductive layer (e.g., ITO) is deposited on the gate insulation layer pattern 6, and a gate electrode pattern 7 and a pixel electrode pattern 8 are formed by the same patterning process for the transparent conductive layer, as shown in FIG. 1. The pixel electrode pattern 8 is electrically connected to the first electrode protection pattern 3 or the second electrode protection pattern 4 through the via hole.

It is to be understood that the first electrode protection pattern 3 is used to protect the first electrode pattern 11 and the first electrode protection pattern 3 is electrically connected to the first electrode pattern 11. The second electrode protection pattern 4 is used to protect the second electrode pattern 12 and the second electrode protection pattern 4 is electrically connected to the second electrode pattern 12.

Thus the pixel electrode pattern 8 is electrically connected to the first electrode protection pattern 3 or the second electrode protection pattern 4. It is equivalent that the pixel electrode pattern 8 is electrically connected to the first electrode pattern 11 or the second electrode pattern 12. It prevents the problem that diffusion or oxidation of Cu on the first electrode pattern 11 or the second electrode pattern 12 results in that the pixel electrode pattern 8 cannot be electrically connected to the first electrode pattern 11 or the second electrode pattern 12. The yield of product is improved.

The gate electrode pattern 7 and the pixel electrode pattern 8 are made of the same material and are formed by the same patterning process. The process is simplified with respect to forming the gate electrode pattern 7 and the pixel electrode pattern 8 separately.

In the embodiments of the present disclosure, the first electrode pattern 11 and the second electrode pattern 12 described above may be a source electrode pattern and a drain electrode pattern. That is, when the first electrode pattern 11 represents a source electrode pattern, the second electrode pattern 12 represents the drain electrode pattern. Correspondingly, the first electrode protection pattern 3 coating the first electrode pattern 11 is electrically connected with the source electrode pattern, and the second electrode protection pattern 4 coating the second electrode pattern 12 is electrically connected to the drain electrode pattern. The pixel electrode pattern 8 is electrically connected to the second electrode protection pattern 4 which is electrically connected to the drain pattern. In turn, if the first electrode pattern 11 represents the drain electrode pattern and the second electrode pattern 12 represents the source electrode pattern, the pixel electrode pattern 8 then is electrically connected to the first electrode protection pattern 3 that is electrically connected to the drain electrode pattern. It is to be understood that the embodiments of the present disclosure in FIG. 1 is described by example of the first electrode pattern 11 representing the source electrode pattern and the second electrode pattern 12 representing the drain electrode pattern.

In the above steps 201 to 206, the electrode material layer 1, the buffer material layer 2, the electrode protection layer, the gate insulation layer, and the transparent conductive layer may be formed by vacuum deposition or magnetron sputtering. The first electrode pattern, the second electrode pattern, the first buffer layer pattern, the second buffer layer pattern, the first electrode protection pattern, the second electrode protection pattern, the gate insulation layer pattern, the gate electrode pattern, and the pixel electrode pattern may be formed by an etching patterning process. The embodiments of the present disclosure will not describe that in detail again.

It should be noted that the electrode material layer 1 may be understood to include a pixel electrode pattern 8 or a layer with the pixel electrode pattern 8 pre-formed. The buffer material layer 2 may be understood to include the first buffer layer pattern 21 and the second buffer layer pattern 22 or a layer with the first buffer layer pattern 21 and the second buffer layer pattern 22 pre-formed.

Embodiments of the present disclosure also provide a display device including the array substrate as described above.

The display device in the embodiments of the present disclosure may be any product or component having a display function, such as a mobile phone, a tablet computer, a television set, a notebook computer, a digital photo frame, a navigator, or the like.

In the description of the present disclosure, numerous specific details are set forth. It will be understood, however, that the embodiments of the disclosure may be practiced without these specific details. In some instances, well-known methods, structures, and techniques have not been shown in detail in order not to obscure the understanding of this specification.

Technical terms or scientific terms used in this disclosure should be interpreted to have the common meaning understood by those skilled in the art. The terms "first", "second", and the like used in this disclosure do not denote any order, quantity, or importance, but rather are used to distinguish different constituent parts. Likewise, the terms "a/an", "one" or "the" and the like are not meant to be limiting the number, but rather denote the presence of at least one. The terms "have" or "include" and the like mean that the element or object preceding the word encompasses the element or object recited after the word and its equivalents, and does not exclude other elements or objects. The terms "connected" or "attached" and the like do not limit a physical or mechanical connection, but may include an electrical connection, whether direct or indirect. The terms "up", "down", "left", "right" and the like are only used to indicate the relative positional relationship, which may change accordingly when the absolute position of the described object changes.

Finally, it should be noted that the above embodiments are merely illustrative of the technical solutions of the present disclosure and are not to be construed as limitations thereof. Although the disclosure has been described in detail with reference to the foregoing embodiments, it will be understood by those skilled in the art that they can still modify the technical solutions described in the foregoing embodiments or equivalently replace some or all of the technical features therein. These modifications or substitutions do not depart the essence of the corresponding technical solutions from the scope of the technical solutions of the embodiments of the present disclosure, and should be encompassed within the scope of the claims and the description of the present disclosure.

What is claimed is:

1. An array substrate comprising:
   a base substrate;
   a first electrode pattern, a second electrode pattern, and an active layer pattern disposed on the base substrate;
   a first electrode protection pattern coating the first electrode pattern; and
   a second electrode protection pattern coating the second electrode pattern, wherein the active layer pattern is disposed between the first electrode pattern and the second electrode pattern, and wherein the first electrode protection pattern and the second electrode protection pattern are connected to two sides of the active layer pattern, respectively, wherein the first electrode pattern except for a lower surface in contact with the base substrate, is covered by the first electrode protection pattern, wherein the first electrode protection pattern extends a first extension portion towards the active layer pattern, and wherein the first extension portion is covered by the first side of the active layer pattern, and wherein the second electrode pattern, except for a lower surface in contact with the base substrate, is covered by the second electrode protection pattern, wherein the second electrode protection pattern extends a second extension portion towards the active layer pattern, and wherein the second extension portion is covered by the second side of the active layer pattern.

2. The array substrate according to claim 1, wherein the material for the first electrode pattern and the second electrode pattern is one of copper and a copper alloy.

3. The array substrate according to claim 1, further comprising i) a first buffer layer pattern disposed between the first electrode pattern and the first electrode protection pattern, and ii) a second buffer layer pattern disposed between the second electrode pattern and the second electrode protection pattern.

4. The array substrate according to claim 3, wherein the material for at least one of the first electrode protection pattern, the second electrode protection pattern, the first buffer layer pattern, and the second buffer layer pattern is one of a molybdenum-niobium alloy and titanium.

5. The array substrate according to claim 1, further comprising:
   a gate insulation layer pattern disposed above the first electrode protection pattern, the second electrode protection pattern, and the active layer pattern; and
   a gate electrode pattern and a pixel electrode pattern disposed above the gate insulation layer pattern, wherein the gate insulation layer pattern comprises a via hole configured to electrically connect the pixel electrode pattern with one of the first electrode protection pattern and the second electrode protection pattern.

6. A display device comprising the array substrate according to claim 1.

7. The display device according to claim 6, wherein the material for the first electrode pattern and the second electrode pattern is one of copper and a copper alloy.

8. The display device according to claim 6, wherein the array substrate further comprises i) a first buffer layer pattern disposed between the first electrode pattern and the first electrode protection pattern, and ii) a second buffer layer pattern disposed between the second electrode pattern and the second electrode protection pattern.

9. A manufacturing method for an array substrate, comprising:
   forming a base substrate;
   forming a first electrode pattern and a second electrode pattern on the base substrate;
   forming a first electrode protection pattern coating the first electrode pattern and a second electrode protection pattern coating the second electrode pattern; and
   forming an active layer pattern between the first electrode protection pattern and the second electrode protection pattern, wherein the first electrode protection pattern and the second electrode protection pattern are connected to two sides of the active layer pattern, respectively, wherein the first electrode pattern, except for a lower surface in contact with the base substrate, is covered by the first electrode protection pattern, wherein the first electrode protection pattern extends a first extension portion towards the active layer pattern, and wherein the first extension portion is covered by the first side of the active layer pattern, and wherein the second electrode pattern, except for a lower surface in contact with the base substrate, is covered by the second electrode protection pattern, wherein the second electrode protection pattern extends a second extension portion towards the active layer pattern, and wherein the second extension portion is covered by the second side of the active layer pattern.

10. The manufacturing method for an array substrate according to claim 9, further comprising:
    when forming the first electrode pattern and the second electrode pattern on the base substrate, further forming a first buffer layer pattern covering on a surface of the first electrode pattern and a second buffer layer pattern covering on a surface of the second electrode pattern, wherein the first electrode protection pattern coats the first buffer layer pattern and the first electrode pattern, and wherein the second electrode protection pattern coats the second buffer layer pattern and the second electrode pattern.

11. The manufacturing method for an array substrate according to claim 10, wherein further forming the first buffer layer pattern covering on the surface of the first electrode pattern and the second buffer layer pattern covering on the surface of the second electrode pattern comprises:
forming an electrode material layer on the base substrate;
forming a buffer material layer after forming the electrode material layer; and
forming the first electrode pattern, the second electrode pattern, the first buffer layer pattern, and the second buffer layer pattern by a patterning process.

12. The manufacturing method for an array substrate according to claim 11, wherein the material for the first electrode pattern and the second electrode pattern is one of copper and a copper alloy.

13. The manufacturing method for an array substrate according to claim 10, further comprising:
forming a gate insulation layer pattern including a via hole above the first electrode protection pattern, the second electrode protection pattern, and the active layer pattern; and
forming a gate electrode pattern and a pixel electrode pattern above the gate insulation layer pattern by a same patterning process, wherein the pixel electrode pattern is electrically connected to one of the first electrode protection pattern and the second electrode protection pattern through the via hole.

14. The manufacturing method for an array substrate according to claim 13, wherein the material for the first electrode pattern and the second electrode pattern is one of copper and a copper alloy.

15. The manufacturing method for an array substrate according to claim 10, wherein the material for at least one of the first electrode protection pattern, the second electrode protection pattern, the first buffer layer pattern, and the second buffer layer pattern is one of a molybdenum-niobium alloy and titanium.

16. The manufacturing method for an array substrate according to claim 15, wherein the material for the first electrode pattern and the second electrode pattern is one of copper and a copper alloy.

17. The manufacturing method for an array substrate according to claim 10, wherein the material for the first electrode pattern and the second electrode pattern is one of copper and a copper alloy.

18. The manufacturing method for an array substrate according to claim 9, wherein the material for the first electrode pattern and the second electrode pattern is copper or a copper alloy.

* * * * *